United States Patent [19]

Neugebauer

[11] Patent Number: 5,748,035
[45] Date of Patent: May 5, 1998

[54] CHANNEL COUPLED FEEDBACK CIRCUITS

[75] Inventor: Charles F. Neugebauer, Palo Alto, Calif.

[73] Assignee: Arithmos, Inc., Santa Clara, Calif.

[21] Appl. No.: 250,709

[22] Filed: May 27, 1994

[51] Int. Cl.$^6$ .................................................. G06G 7/26
[52] U.S. Cl. ........................... 327/562; 327/566; 377/59; 377/62; 377/63; 257/236; 257/238; 257/239
[58] Field of Search .................................. 327/560, 561, 327/562, 563, 564, 565, 566, 567, 306, 537, 538, 543, 271; 330/86, 253, 254, 258, 259, 260, 261, 296; 257/235–239; 377/57–63

[56] References Cited

U.S. PATENT DOCUMENTS

| | | | |
|---|---|---|---|
| 4,156,818 | 5/1979 | Collins et al. | 377/60 |
| 4,159,430 | 6/1979 | Boudewijns et al. | 377/63 |
| 4,242,600 | 12/1980 | Hoffmann et al. | 377/58 |
| 4,303,839 | 12/1981 | Berger et al. | 327/566 |
| 4,453,090 | 6/1984 | Sempel | 327/566 |
| 4,627,083 | 12/1986 | Pelgrom et al. | 377/60 |
| 4,631,739 | 12/1986 | Handy | 377/60 |
| 4,656,437 | 4/1987 | Saari | 330/253 |
| 4,716,580 | 12/1987 | Berger | 377/62 |
| 4,757,276 | 7/1988 | Ishii et al. | 330/278 |
| 4,801,893 | 1/1989 | Perandi | 330/300 |
| 4,808,943 | 2/1989 | Hayakawa | 330/51 |
| 4,841,254 | 6/1989 | Bukowski et al. | 330/253 |
| 4,987,558 | 1/1991 | Slob | 377/57 |
| 4,987,580 | 1/1991 | Pelgrom et al. | 377/60 |
| 4,992,755 | 2/1991 | Seevinck et al. | 330/259 |
| 5,103,158 | 4/1992 | Cho et al. | 327/537 |
| 5,180,988 | 1/1993 | McDaniel | 330/282 |
| 5,216,381 | 6/1993 | Botti et al. | 330/253 |
| 5,216,385 | 6/1993 | McDaniel | 330/282 |
| 5,338,978 | 8/1994 | Larsen et al. | 327/333 |
| 5,438,213 | 8/1995 | Tailliet | 257/360 |

FOREIGN PATENT DOCUMENTS

| | | |
|---|---|---|
| 0072741 | 2/1983 | European Pat. Off. |
| 0169754 | 1/1986 | European Pat. Off. |
| 2200684 | 4/1974 | France. |
| 2030406 | 9/1979 | United Kingdom. |
| 9610239 | 5/1996 | WIPO. |

OTHER PUBLICATIONS

International Search Report for International Application No. PCT/US95/14933 mailed Jun. 20, 1996.

McCreary and Grey, All –MOS Charge Redistribution Analog–to–Digital Conversion Techniques—Part I, *IEEE Journal of Solid State Circuits*, vol. SC–10, No. 6, Dec. 1975, pp. 371–379.

Brodersen, et al., MOS Switched–Capacitor Filters, *Proceedings of the IEEE*, vol. 67, No. 1, Jan. 1979, pp. 61–75.

(List continued on next page.)

*Primary Examiner*—Timothy P. Callahan
*Assistant Examiner*—Kenneth B. Wells
*Attorney, Agent, or Firm*—Lyon & Lyon LLP

[57] ABSTRACT

Channel coupled feedback- technology for implementing many analog and digital signal processing functions in a single-polysilicon digital IC fabrication process is described. Field effect transistors are constructed having a common channel and the substrate regions of the field effect transistors in the channel are electronically connected. Thus, a fixed amount of charge can freely move within the channel in response to the application of the signal to be processed. By sensing the charge transferred within the channel when the input signal is applied, many signal processing functions are possible. Fixed-gain amplifiers, offset compensated amplifiers, integrators, differentiators, analog-to-digital converters, digital-to-analog converters, switchable gain amplifiers, automatic gain control systems, and linear transform computation circuits are constructed entirely with field effect transistors, eliminating the need for passive components for most signal processing functions.

38 Claims, 12 Drawing Sheets

OTHER PUBLICATIONS

Gregorian and Temes, *Analog MOS Integrated Circuits*, John Wiley & Sons (1986), pp. 68–93 no month.

Allstot and Black, Technological Design Consideration for Monolithic MOS Switched–Capacitor Filtering Systems, *Proceedings of the IEEE*, vol. 71, No. 8, pp. 967–986 (1983) no month.

Gray and Meyer, *Analysis and Design of Analog Integrated Circuits*, John Wiley & Sons (1984), pp. 147–148 no month.

McCreary, Matching Properties, and Voltage and Temperature Dependence of MOS Capacitors, *IEEE J. Solid–State Circuits*, vol. SC–16, No. 6, Dec. 1981, pp. 608–618.

Miida, Takashi et al., "A CCD Video Delay Line with Charge–Integrating Amplifier,"*IEEE* vol. 26, No. 12, pp. 1915–1919 (1991) no month.

Sauer, D.J. et al., "A CCD Comb Filter IC for TV Receivers," *1980 IEEE Int'l Solid State Circuits Conference*, pp. 32–33 and 258 (1980) no month.

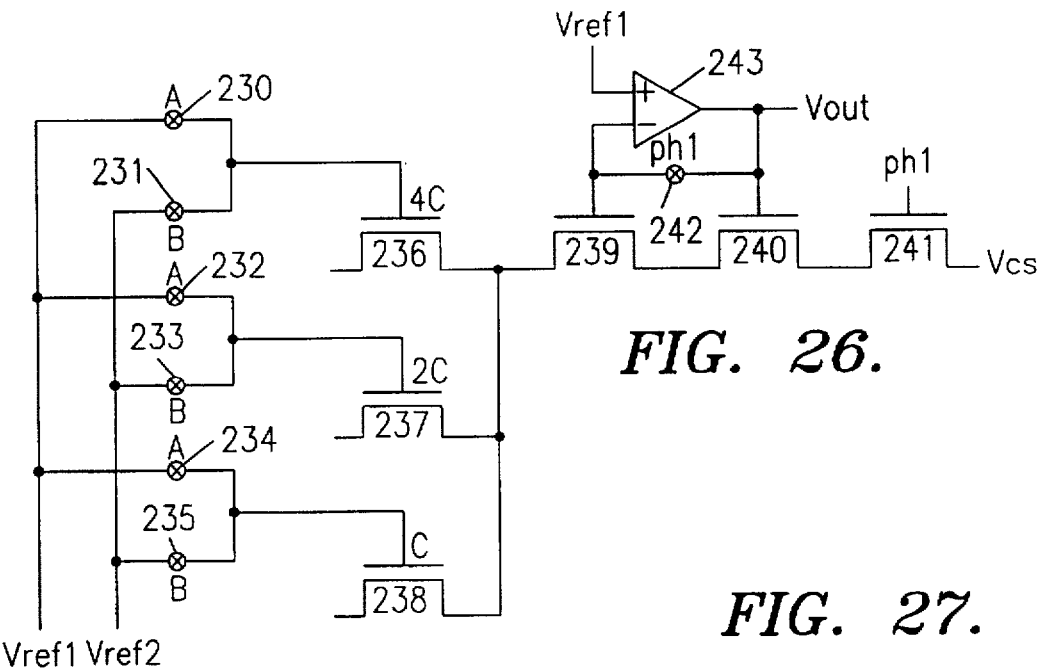
FIG. 26.
FIG. 27.
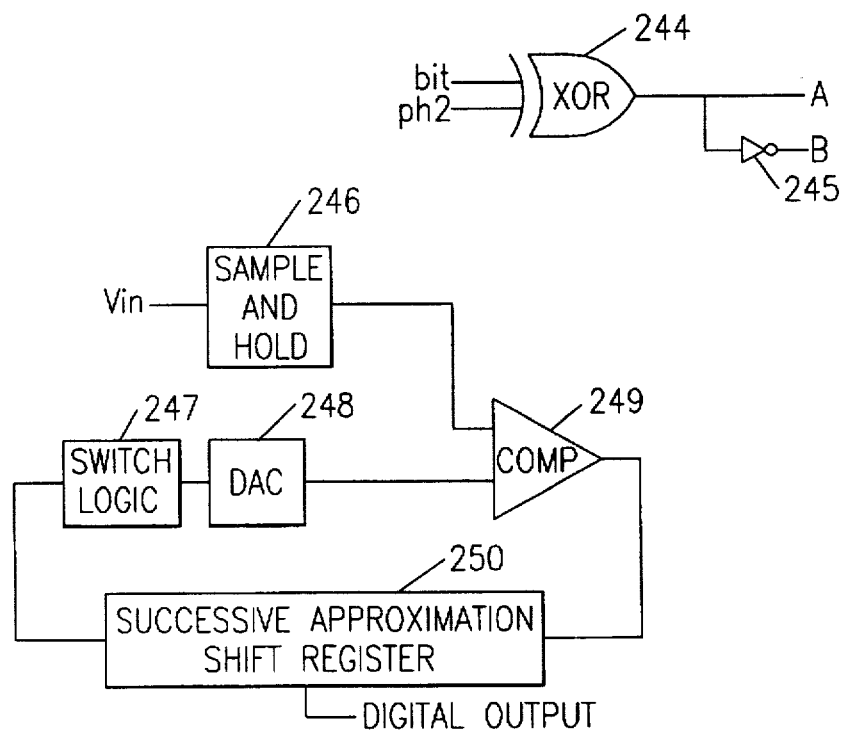
FIG. 28.

CHANNEL COUPLED FEEDBACK CIRCUITS

TECHNICAL FIELD

The present invention relates to electronic circuits. Specifically, the present invention relates to amplifiers that have channel coupled feedback circuits to perform signal processing functions.

BACKGROUND

Feedback is an important aspect of many signal processing circuits. In control systems, feedback consists of comparing the actual output of the system with the desired output and making corrections accordingly. In fixed gain amplifier circuits, the output voltage of the amplifier should be a multiple of the input voltage. Therefore, in a feedback amplifier, the input voltage is compared with an attenuated version of the output voltage.

Negative feedback is the process of coupling the output voltage of an amplifier back in such a way as to cancel some of the input voltage. While negative feedback lowers the gain of the amplifier, it serves to improve other characteristics of the amplifier, such as freedom from distortion and non-linearity, flatness of response and predictability. In fact, as more negative feedback is used, the resultant amplifier characteristics become less dependent upon the characteristics of the open-loop (no-feedback) amplifier and finally depend only upon the properties of the feedback network itself. See generally, Horowitz and Hill, *The Art of Electronics*, Cambridge University Press (2nd Ed. 1989), pp. 175-250.

Traditionally, feedback and analog signal processing functions have been designed using passive components, such as resistors or capacitors. For example, FIG. 2 shows a conventional inverting, fixed-gain amplifier circuit having a resistor (9) in the feedback loop. Based upon the facts that (a) the amplifier (10) adjusts its output so as to make the voltage difference between its inputs equal zero and (b) the inputs of the amplifier draw virtually no current, the following relationship is evident:

$$V_{out}/R_2 = -V_{in}/R_1.$$

By rearranging this equation, the voltage gain of the amplifier ($V_{out}/V_{in}$) is equal to the ratio of the two resistors ($-R_2/R_1$). Therefore, one can change the gain of an inverting, fixed-gain amplifier by altering the resistivity of the feedback resistors. See Horowitz and Hill, pp. 177-178.

The inverting amplifier shown in FIG. 2 is a useful device for analog signal processing. An analog system carries signals in the form of voltages, currents, charges, etc., that are continuous functions of a continuous time variable. Some typical examples of analog signal processors are audio amplifiers and telecommunications systems. By contrast, in a digital system each signal is represented by a sequence of numbers or discrete values. A typical example of a digital system is a microprocessor in which the computations are done in terms of "1s" and "0s".

Prior to the mid-1970s, analog signal processing systems were not widely implemented using monolithic integrated circuit (IC) technology, particularly metal-oxide semiconductor (MOS) technology, primarily because most analog signal processing circuits require precise passive components, such as resistors and capacitors. An absolute precision resistor or capacitor is still difficult given the capability of current IC fabrication technology.

However, in the late 1970s and thereafter, a design technique known as switched capacitor circuits emerged. Using this design technique, the combination of a capacitor and a few transistor switches can functionally replace a resistor. FIG. 3 shows a switched capacitor circuit that is equivalent in function to the inverting, fixed-gain amplifier of FIG. 2. By properly choosing the size of the capacitors (14) and (16) and the transistor switch clocking scheme (12), (13) and (15), the need for monolithic resistors in IC design can be eliminated. See generally, Gregorian and Temes, *Analog MOS Integrated Circuits*, John Wiley & Sons (1986); Allen and Holberg, *CMOS Analog Circuit Design*, Holt, Rinehart & Winston (1987).

Several advantages are inherent to the use of switched capacitor circuit designs. First, monolithic resistors require an inordinately large area of the IC. The capacitor and switches that replace the resistor may require less than 1% of the area that the equivalent resistor would require. Thus, the use of switched capacitors in place of resistors generally serves to reduce the size of the IC necessary for a given signal processing function.

Second, the accuracy of switched capacitor circuits relies primarily upon the ratios of monolithic capacitors, rather than the precision of each capacitor individually. The matching of two identical capacitors within the same die area of most MOS ICs can be highly accurate and can be in the range of 0.1-1%. Therefore, the accuracy of analog processing circuits using switched capacitors can be improved over circuits using monolithic resistors.

While the use of monolithic capacitors has permitted the design of many monolithic analog signal processing systems, the use of monolithic capacitors is not without disadvantages. Monolithic capacitors generally can be classified into either is of two types depending upon the host material for the thermally grown silicon dioxide dielectric layer: (1) capacitors formed on heavily doped crystalline silicon (FIG. 4) or (2) capacitors formed on poly-crystalline silicon (polysilicon) (FIG. 5). Conventional switched capacitor circuits are currently fabricated in special complementary metal-oxide semiconductor (CMOS) fabrication processes that have special fabrication steps required to implement accurate capacitors. For further instruction on designing monolithic analog processing circuits using monolithic passive components, see Allstot and Black, *Technological Design Considerations for Monolithic MOS Switched-Capacitor Filtering Systems*, Proceedings of the IEEE, Vol. 71, No. 8, pp. 967-986 (1983).

The capacitor shown in FIG. 4 is manufactured by growing a thin oxide over the top of the silicon crystal and diffusing either n+ or p+ ions through the thin oxide into the silicon crystal (20). After this heavy (ion) diffusion step, a conducting layer of either metal or polysilicon (19) is placed on top of the thin oxide.

For common silicon gate CMOS processes, the diffused capacitor plate requires an extra lithography step. This extra lithography step can adversely impact yield and hence result in a higher fabrication cost.

Also, the bottom (diffusion) electrode (20) has a large non-linear capacitance (voltage coefficient) due to coupling to the substrate (21) (also known as the bulk). Gregorian and Temes, p.89. This heavy diffusion-to-substrate back plate also has a junction leakage current associated with it. Id.; Gray and Meyer, *Analysis and Design of Analog Integrated Circuits*, John Wiley & Sons (1984), p. 148. Therefore, in order to achieve accurate analog processing, the voltage on the diffusion electrode (20) cannot be permitted to float, or parasitic capacitance problems and leakage induced drift will be significant.

As for the second type of capacitor that uses a polysilicon layer for the bottom electrode (FIG. 5), a thin oxide must be grown on top of the polysilicon layer (24). Growing a thin oxide on top of polysilicon leads to accuracy and yield problems, because the granularity of the polysilicon surface presents a poor oxidation host surface. Gregorian and Temes, pp. 88–89. Since the growth of the thin oxide (insulator) layer is not well controlled, MOS capacitor matching becomes more difficult. Typically, a thicker oxide layer is grown on top of the polysilicon layer to help overcome the granularity problem. But the capacitance per unit area of the capacitor is reduced when the insulating layer is thickened, thereby effectively increasing the size of the capacitors required to implement a desired function.

Using either of these types of capacitors, additional problems are incurred depending upon whether the top electrode (23) is metal or polysilicon. If metal is used, metal ions can diffuse into the thin oxide layer, thereby reducing the insulating properties of the oxide layer. Also, using metal as an electrode leads to accuracy problems because the conductance of the metal electrode is effectively increased by the amount of metal interconnect (22) that is bonded to the capacitor.

If a double polysilicon capacitor is desired (i.e., both the top and bottom electrodes (23, 24) are polysilicon), the cost of manufacturing the IC will be increased. Since an extra mask step is necessary to add the second polysilicon layer, a lower IC yield can be expected.

Most digital IC fabrication processes typically only require the fabrication of transistors and low accuracy capacitors. Current digital IC fabrication processes have many well-controlled parameters including a uniform transistor threshold voltage and uniform thin oxide thickness (local relative accuracy of about 0.05%). Since most conventional digital IC processes provide only a single polysilicon layer, these fabrication processes are currently the least expensive IC manufacturing processes available. But since these digital processes lack a second polysilicon layer or a diffused capacitor plate, thermally grown oxide capacitors cannot be fabricated and therefore switched capacitor circuits are not normally fabricated in these digital processes. Only parasitic capacitors, such as polysilicon to metal capacitors, are available, but these capacitors lack good fabrication control and have an undesirably low value of capacitance per unit area.

SUMMARY OF THE INVENTION

In view of these limitations in the prior art, one object of the present invention is to provide for monolithic electronic amplification circuits that have feedback and analog signal processing functions that do not require the construction of monolithic resistors or capacitors.

A second object of the present invention is to provide accurate analog signal processing circuits that can be fabricated in conventional digital processes, thereby eliminating the need for specialty fabrication processes for many signal processing functions and consequently decreasing the cost of manufacturing these circuits.

A third object of the present invention is to increase the accuracy of analog processing circuits by eliminating the need for monolithic passive components, such as capacitors and resistors.

A fourth object of the present invention is to increase the integration density of analog signal processing circuits by eliminating the need for resistor and capacitor components.

Increasing circuit density will serve to reduce silicon requirements to implement many circuit functions and thereby reduce manufacturing costs.

A fifth object of the present invention is to provide analog signal processing circuits that can replace conventional switched capacitor circuits and be monolithically integrated on the same substrate as high density digital CMOS circuitry.

Other objects of the present invention will become apparent as the description proceeds.

The present invention relates to the novel technology of channel coupled feedback circuits for making accurate and reliable signal processing circuitry. By using channel coupled feedback circuits, circuit functions previously performed by switched capacitor or resistor components can be implemented in conventional digital IC fabrication processes that do not require or provide for a special capacitor or resistor layer. In fact, many analog and digital signal processing functions that are currently capable of monolithic integration can now be implemented solely with semiconductor devices using the present invention, thereby completely eliminating the need for passive components, such as capacitors and resistors for these circuit functions. Preferably an inverting, fixed-gain amplifier is constructed solely with field effect transistors (FETs).

As illustrated in FIG. 1, channel coupled feedback technology used in the present invention is characterized by (a) one or more channel reset device(s) (1) that serve to set the amount of charge in the channel during the computation phase, and (b) two or more channel coupled semiconductors (CCSCs) (3) that perform the signal processing function in conjunction with (c) a means (5) for sensing charge transfer within the channel which means may also maintain the surface voltage of the channel constant. The CCSCs (3) are preferentially FETs and are electronically connected or coupled to each other and to the channel reset device(s) (1). The channel reset device(s) (1) preferably are FETs, but can be any means for controlling the flow of charge into the channel. The means (5) for sensing the charge transferred within the channel and for maintaining the surface voltage of the channel constant is preferentially an operational amplifier.

Preferably, signal processing operations are performed in the present invention by setting the channel to a fixed reset voltage having a fixed amount of charge. An input signal (6) is applied to one or more of the CCSCs (3) which will cause charge to be transferred under the CCSCs within the channel if the input signal differs from the reset voltage. By sensing the amount of charge that has been transferred within the channel, channel coupled semiconductor devices can perform many feedback and signal processing functions, including but not limited to is fixed-gain, sample and hold, addition, subtraction, offset compensation, integration, differentiation, analog-to-digital conversion, digital-to-analog conversion, switchable gain, ladder filtering and linear transform computation.

In one aspect of the present invention, channel coupled feedback operation can be summarized as follows. In the reset phase of the signal processing operation, a reset signal is applied to the channel reset device(s), so as to allow charge to fill the channel from a charge source. The surface potential of the channel is fixed at a desired level during this phase. Upon the removal of the reset signal, the channel is disconnected from the charge source.

Preferably, the channel reset device is one FET. In the reset phase, a reset voltage is applied to the gate of the channel reset FET permitting the substrate under the FET gate to become conductive. In the post-reset phase, a post-reset voltage is applied to the gate, causing the channel reset FET to become non-conductive and to act as a barrier preventing charge from moving either into or out of the channel.

In the computation phase of the feedback or signal processing operation, the input signal (e.g., a voltage) to be processed is applied to the gate of at least one of the channel coupled semiconductors within the channel. Preferably, the channel coupled semiconductors are FETs. Applying the input signal to the gate of one of the FETs causes the amount of charge under the gate of that FET to change, which change is proportional to the input signal voltage applied to the gate and the area of the gate. The charge is transferred to or from the substrate underneath the gates of the other FET(s) within the channel. By adding a device to sense the charge movement within the channel, preferably an operational amplifier, a variety of analog and digital signal processing functions are possible. These channel coupled semiconductors are preferentially employed to perform the signal processing functions normally associated with conventional feedback functions that previously have been constructed with passive components, such as capacitors or resistors.

Applicant has therefore invented a channel coupled feedback technology that can be used to implement a variety of feedback and signal processing functions in commodity digital IC fabrication processes. The need for precision passive components is avoided and the cost of implementing circuit functionality is reduced. Circuits constructed according to the present invention will also serve to increase the integration density of most analog signal processing circuits, thereby reducing the silicon area necessary to implement these circuit functions. Further, since many commodity digital processes have well controlled transistor fabrication steps, the accuracy of many analog signal processing circuits can be improved.

BRIEF DESCRIPTION OF THE FIGURES

FIG. 26 is a digital-to-analog converter constructed according to the present invention.

FIG. 27 is a logic diagram that is appropriate to generate the clocking scheme to implement the circuit of FIG. 26.

FIG. 28 is a block diagram of a successive approximation analog-to-digital converter constructed according to the present invention.

DETAILED DESCRIPTION OF THE INVENTION

Figure 1:
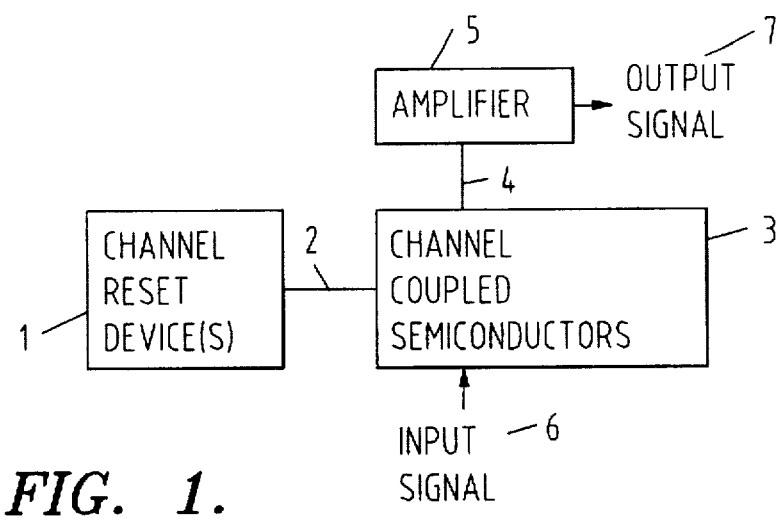
FIG. 1 is a block diagram of channel coupled feedback circuits constructed according to the present invention.
Figure 2:
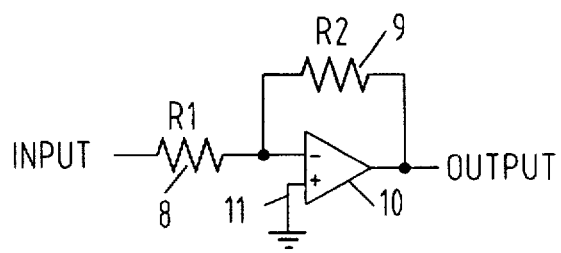
FIG. 2 is schematic of a conventional inverting, fixed-gain amplifier implemented with resistors.
Figure 3:
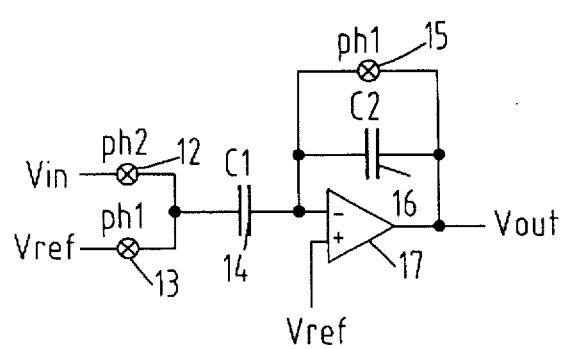
FIG. 3 is a schematic of a conventional inverting, fixed-gain amplifier implemented with switched capacitors.
Figure 4:
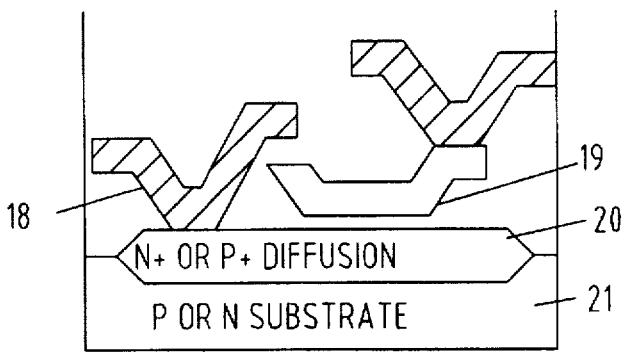
FIG. 4 is a cross-section of a conventional monolithic capacitor having a diffusion bottom electrode and either a metal or polysilicon top electrode.
Figure 5:
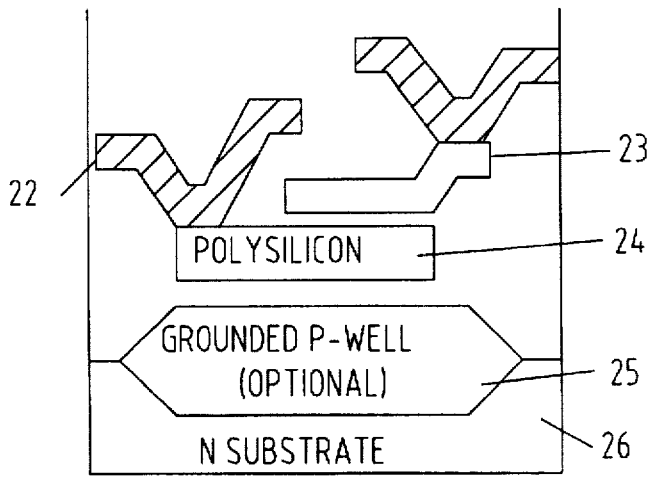
FIG. 5 is a cross-section of a conventional monolithic capacitor having a polysilicon bottom electrode and either a metal or polysilicon top electrode.
Figure 6:
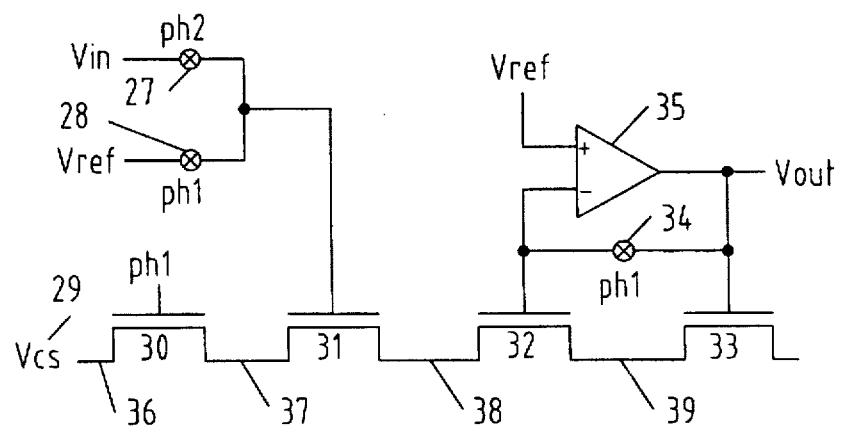
FIG. 6 is a schematic of an inverting, fixed-gain amplifier implemented with the channel coupled feedback technology of the present invention.

As the illustrations and description herein show, applicant has invented channel coupled feedback circuits that can be used to implement a variety of analog and digital signal processing functions. The operation and effect of channel coupled feedback circuits (FIG. 1) can be understood by an analysis of the preferred embodiment—an inverting, fixed-gain amplifier constructed according to the present invention, as shown in FIG. 6. The circuit of FIG. 6 can perform the same signal processing function as the conventional circuits shown in FIGS. 2 and 3. A monolithic inverting, fixed-gain amplifier constructed with channel coupled semiconductors does not require monolithic resistive elements (8, 9) as in FIG. 2 or well-matched monolithic capacitors (14, 16) fabricated with a special process having two capacitor electrode layers as in FIG. 3. Instead, the functionally equivalent circuit shown in FIG. 6 can be constructed entirely in a conventional digital IC fabrication process designed to implement FETs only.

An inverting, fixed-gain amplifier can be constructed, for example, with three channel coupled semiconductors ("CCSCs"). In applicant's preferred embodiment, the channel coupled semiconductors are, in fact, channel coupled FETs, in which voltage all three FETs share a common channel. Referring to FIG. 6, applicant preferably employs one channel reset device, FET (30), to permit charge to move into and out of the channel during the reset phase of operation. This device (30) essentially performs a switching function at one end of the channel. When the switch (channel reset device) is closed, charge is conducted either into or out of the channel, depending upon the surface voltage of the channel, in order to achieve potential equilibrium within the channel. Once potential equilibrium is achieved, the switch may be opened, thereby fixing the amount of charge within the channel. Those skilled in the art will recognize that only one device is necessary to permit the movement of charge into or out of the channel, but that increasing the number of switches between the channel and a charge source may permit the channel to reach potential equilibrium faster.

Also, the type of charge reset device (30) utilized is not essential to practice the invention. Any device that permits switching control to a source of charge is appropriate for use with the present invention. For example, a bipolar transistor, a charge coupled device (CCD) or a more elaborate switching means, such as a T-gate, also may be employed to provide the channel reset function, depending upon the performance characteristics desired by the IC designer.

In FIG. 6, one terminal of FET (30) is electronically connected to $V_{CS}$ (29), which connection provides a supply of charge for the channel. $V_{CS}$ represents a channel set voltage. The channel reset device(s) is (are) connected to $V_{CS}$, which preferably is a small positive voltage, but those skilled in the art will recognize that a variety of voltage sources can be used to supply charge to the channel, including electrical ground.

Therefore, the reader will note that the IC designer has great latitude in deciding how many channel reset devices to provide for the channel, the type of device to be used to perform the switching function and the voltage source that is connected to the channel by the channel reset device(s). Preferably, applicant uses one FET (30) to perform the switching means and FET (30) is connected to a small positive voltage, $V_{CS}$ (29), to supply charge to the channel.

Figure 7:
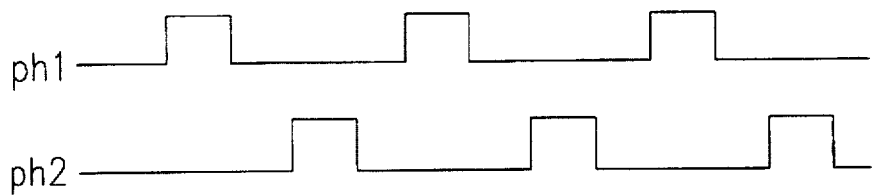
FIG. 7 is a clock diagram appropriate to implement the circuit of FIG. 6.

Referring again to FIG. 6, the gate of the channel reset FET (30) is controlled by the phi clock signal. An appropriate clocking scheme for the circuit of FIG. 6 is shown in FIG. 7. In a preferred embodiment the clocking scheme is comprised of two non-overlapping clocks (ph1 and ph2). When ph1 is high, a reset voltage is applied to the gate of the channel reset FET (30), which reset voltage in turn permits electrons to flow into or out of the channel through FET (30). When ph1 is low a post-reset voltage is applied to the gate of the channel reset FET (30), thereby preventing flow of electrons into or out of the channel. A zero voltage signal is appropriate for the second phase of ph1. Referring back to FIG. 6, FET (30) serves to conduct electrons into or out of the channel during the reset phase and then acts as an electron barrier during the signal processing or computation phase, maintaining a constant or fixed amount of charge in the channel.

In the embodiment shown in FIG. 6, three channel coupled semiconductors, FETs (31), (32) and (33), share the common channel and the substrate regions of the channel FETs are electronically connected or coupled so that charge can move freely between the substrate regions beneath the FETs. The substrate underneath the gate of a FET is a lightly doped silicon crystal. Acting as a true semiconductor, when a zero voltage is applied to a gate of the surface of a lightly doped p-type silicon crystal, electrons are not conducted within the substrate. Therefore outside of the channel, no voltage is applied to the lightly doped substrate and thus, no electrons are conducted.

When a voltage is applied to the gate of a FET, charge within the substrate is attracted to the substrate surface. Those skilled in the art will recognize that if a negative voltage is applied to the gate, positive charge will be attracted to the substrate surface and vice versa. Those skilled in the art will recognize that when the gate voltage of the FET reaches the threshold voltage, the substrate underneath the gate becomes inverted. This attracted charge is mobile and can be moved within the inverted substrate underneath the gate. By providing a means (38, 39) for electronically connecting the inverted substrate regions underneath the gates of the FETs (31–33) within the channel, charge can move freely throughout the common channel, when the gates of FETs (31–33) are held at a voltage permitting conduction underneath the gates. The means (37–39) for electronically connecting the substrates can be, for example, either a heavily doped ion diffusion implant, polysilicon, metal interconnect, a charge-coupled device (CCD) or an additional FET between the two FETs to be connected, wherein the additional FET is biased to be conductive.

Therefore, as used herein, the channel is comprised of (a) the semiconductor substrate regions underneath the gates of the channel coupled semiconductors that are inverted when the device threshold voltage is applied to the gate and (b) the means for electronically connecting the substrate regions. The channel is connected to the channel reset device(s), which channel reset device(s) can also connect the channel to a voltage (charge) source. The layout of the semiconductor substrate regions and the connection means are not essential to practice the invention, nor is the order in which the semiconductor substrates are connected within the channel.

Preferably, the applicant uses FETs to perform the feedback or signal processing functions. For this purpose, a FET is defined as a device having a metal or polysilicon gate and heavy (ion) diffusion implants for the drain and source terminals. In the preferred embodiment, the means (38, 39) for electronically connecting any two FETs within the channel, and for that matter the means (37) for connecting a FET within the channel to the channel reset device(s), is the heavy (ion) diffusion implant. The two FETs to be electronically connected may share a heavy diffusion implant, where this implant serves, for example, as the drain of one FET and the source of the second FET. Therefore, the implant acts as means for conducting charge from the substrate region of one FET to the substrate region of the second FET.

One skilled in the art should recognize that the essential function of the channel coupled FET in the preferred embodiment of the present invention is the use of the gate of the FET and the lightly-doped substrate underneath the gate in a manner that is functionally equivalent to a capacitor. The source and drain implants of the FETs are merely used as means for electronically connecting or coupling the substrates underneath the FETs. Thus, to practice the present invention a channel coupled semiconductor device is comprised of a gate separated from the lightly doped silicon crystal (substrate) by a silicon dioxide layer (insulator). The lightly doped silicon crystal substrate does not conduct when a zero voltage is applied to the surface of the substrate.

Therefore, as used herein, a channel coupled semiconductor is a device having at least (a) a gate constructed of a conducting material, preferably polysilicon, (b) a lightly doped silicon crystal substrate and (c) an oxide (insulating) layer separating the gate and the substrate. The oxide (insulating) layer is preferably silicon dioxide, although those skilled in the art will recognize that other materials may be used for the insulating layer, such as $Si_3N_4$. As noted above, the substrates of the channel coupled semiconductors can be connected by, for example, diffusion (ion) implants, polysilicon, metal, a CCD, or some combination of these elements. As will be shown in FIG. 16 that is discussed below, two substrates also can be connected by an additional gate above the lightly doped substrate, where the gate is biased such that the substrate underneath the gate is conductive.

Figure 8:
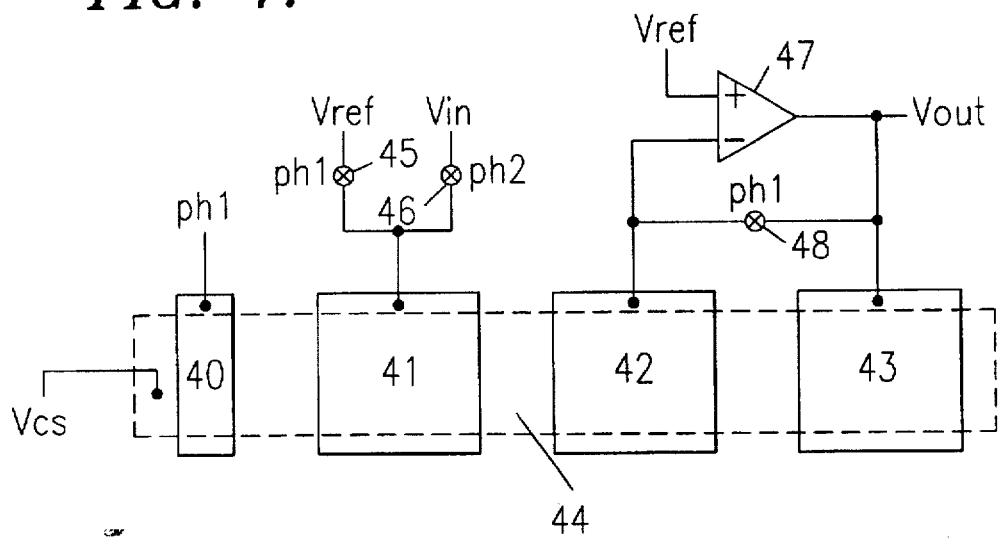
FIG. 8 is a top view of a layout of the circuit of FIG. 6.

Those skilled in the art will recognize in view of the present disclosure that the particular arrangement of the semiconductors within the channel is not important to the invention. Since charge can move freely within the common channel, the location of any specific channel coupled semiconductor or channel reset device is not essential to practice the invention. For example, FIG. 8 shows a top view of a layout for FIG. 6. The reader will note that the solid line blocks represent the gates of the channel coupled semiconductors (41–43) and the channel reset device (40). For example, block (41) represents the gate of FET (31) in FIG. 6. The dashed line structure (44) represents the channel, which is a combination of (a) lightly doped substrate and thin oxide underneath the gates and (b) heavy (ion) diffusion. The solid lines represent standard electrical connections (wires) which may be metal, polysilicon or a heavy (ion) diffusion, for example.

Figure 9:
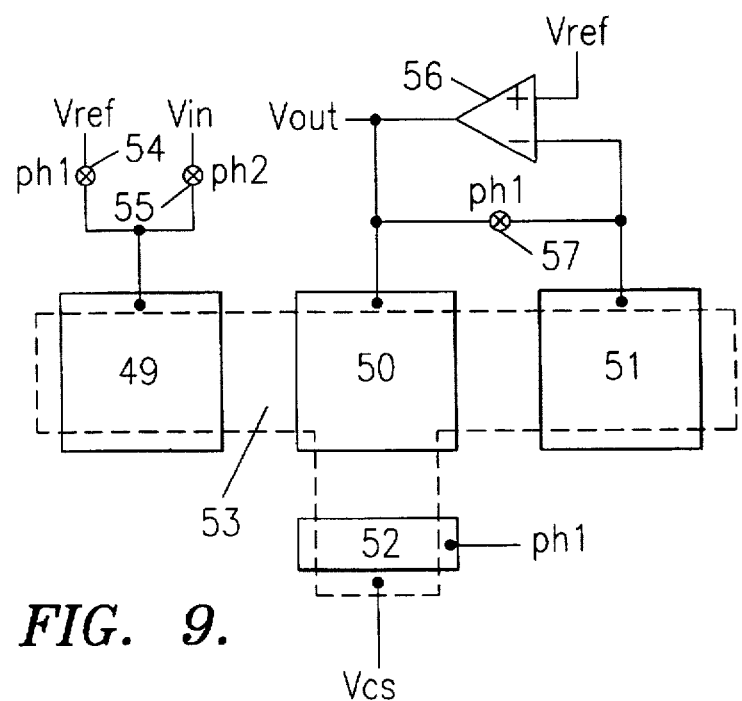
FIG. 9 is a top view of a second layout of an inverting fixed gain amplifier constructed according to the present invention.
Figure 10:
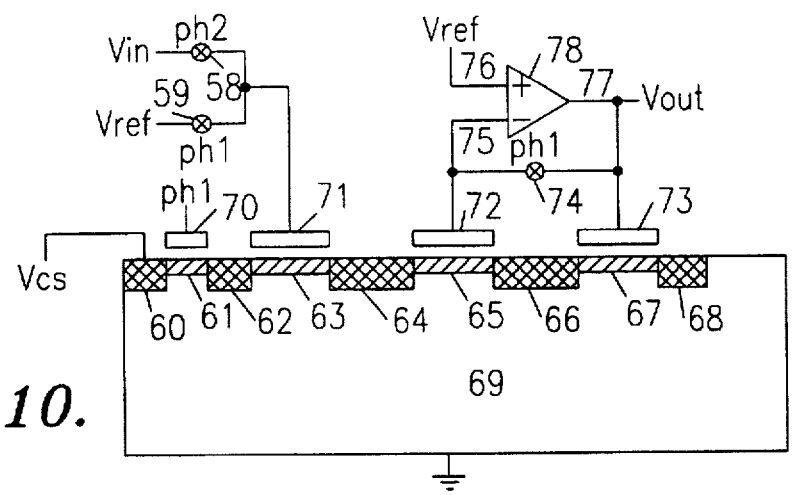
FIG. 10 is a schematic of the circuit of FIG. 6 with a conceptual physical cross section of the channel coupled semiconductors.

Consistent with the previous discussions, FIG. 9 shows a different layout for a fixed-gain amplifier that is equivalent in function to the circuit of FIG. 6. In this figure, the reader will note that a channel reset device (52) has been connected to the substrate region of the channel coupled semiconductor whose gate (50) is connected to the output of the amplifier (56). Also, note that gates (50, 51) have been switched in order from the location in FIG. 8. Thus, the arrangement and the location of the channel coupled semiconductors, the channel reset device(s) and the amplifier is within the discretion of the IC designer. Also, those skilled in the art will recognize that additional semiconductors, FETs or even passive components can be used to modify the functionality of the circuit without departing from the spirit of the invention.

Therefore, the reader will note that the IC designer has great flexibility, for example, in deciding the number of channel coupled semiconductors to use in the channel, the material to be used to electronically connect the substrate regions, the arrangement of channel coupled semiconductors within the channel, and the order in which the semiconductor substrates are connected.

Referring back to FIG. 6, in the preferred embodiment the gate of FET (31) can be connected to $V_{ref}$ in one phase and to $V_{in}$ (the input signal to be processed) in the second phase. The gate of FET (32) is connected to the inverting (−) input of the operational amplifier (35). The gate of FET (33) is connected to the output terminal of the amplifier (35). The gates of FETs (32) and (33) are connected through switch (34) during the reset phase (ph1 is high).

Those skilled in the art will recognize in light of the present disclosure that the design of the operational amplifier (35) is not essential to practice the present invention. Many conventional operational amplifier designs are appropriate for use with the present invention. The designs for a variety of operational amplifiers appropriate for use with the present invention can be found both in Gregorian and Temes and in Allen and Holberg. The IC designer has great flexibility in choosing the design of the operational amplifier to maximize desired performance characteristics, such as power, slew rate, accuracy, settling rate, etc.

Also, the non-inverting (+) input of the amplifier (35) is connected to a reference voltage ($V_{ref}$) in the present example, but those skilled in the art will recognize that, depending upon the specific application of the present invention, the non-inverting input can also be connected to some other constant voltage that is between the power supply rails for the amplifier. In one aspect of the preset invention, the amplifier is an inverting, fixed-gain high voltage amplifier capable of amplifying a video image input signal into a high voltage output signal to be driven onto a liquid crystal display. Further details concerning the operation and effect of this amplifier can be found in U.S. patent application Ser. No. 08/185,540, the disclosure of which is incorporated herein by reference.

Figure 11:
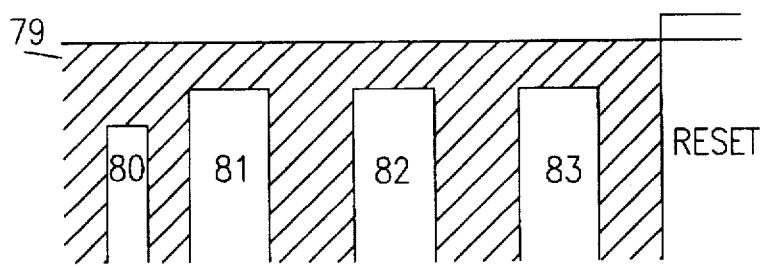
FIG. 11 is an electron well diagram of the circuit of FIG. 10 in the reset phase of the circuit operation.
Figure 12:
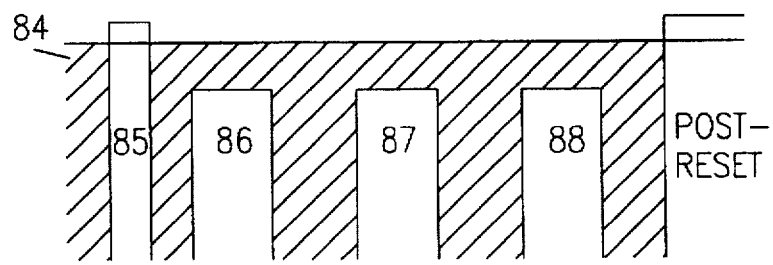
FIG. 12 is an electron well diagram of the circuit of FIG. 10 in the post-reset phase of the circuit operation.
Figure 13:
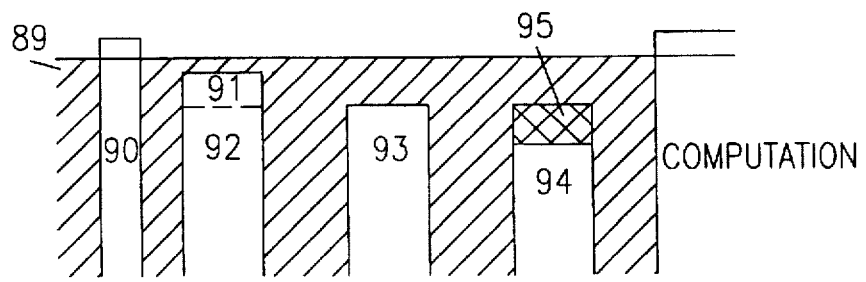
FIG. 13 is an electron well diagram of the circuit of FIG. 10 in the signal processing or computation phase of the circuit operation.

Referring to FIGS. 10–13, the operation of the channel coupled semiconductors in an inverting, fixed-gain amplifier system is best understood by examining electron well diagrams of the channel during each phase of the signal processing operation. For illustrative purposes, the circuit of FIG. 6 has been redrawn in FIG. 10 to show the substrate regions of the channel coupled feedback circuits. FIGS. 11, 12 and 13 show electron well diagrams for the reset, post-reset and computation phases, respectively. While not wishing to be bound by theory, applicant believes the operation and effect of channel coupled semiconductors can be best understood by analyzing how charge moves within the channel during the reset, post-reset and signal processing operation phases of the device. All four FIGS. (10–13) should be viewed together.

As shown in FIG. 11, during the reset phase, the channel reset FET (70) is pulsed by the phi signal shown in FIG. 7, so as to allow charge to flow into or out of the channel. Ph2 is low during this phase. A reference voltage ($V_{ref}$) is applied to FET gate (71). With the switch (74) closed between FET gates (72) and (73), the amplifier (78) is in a unity gain follower configuration. Therefore, $V_{ref}$ is also applied to FET gates (72) and (73). Thus, during the reset phase, the gate voltages of the channel coupled FETs are set to $V_{ref}$ by operation of the amplifier (78) and FET gates (71), (72) and (73), and charge is permitted to move into the channel via the channel reset FET (70), so that potential equilibrium is achieved within the channel. In FIGS. 11, 12 and 13 mobile charge within the inverted substrate is designated by a diagonal cross hatch.

As is shown in FIG. 12, during the post-reset phase, the channel reset FET (70) is pulsed so as to provide a barrier to the movement of electrons into or out of the channel, preferably by applying a zero volt signal to FET gate (70), as is shown in FIG. 7. In this phase, both ph1 and ph2 are low. Therefore, the channel becomes electronically isolated from the charge source, $V_{CS}$, with a fixed amount of charge within the channel and has a common channel gate voltage of $V_{ref}$.

As shown in FIG. 13, during the signal processing or computation operation, the input signal ($V_{in}$) is applied to the gate of FET (71). This operation is performed when ph1 is low is and ph2 is high. In the example shown in FIG. 13, $V_{in}$ is a lower voltage than $V_{ref}$ thereby causing electrons to be forced out of the substrate region immediately underneath FET gate (71). The dashed section (91) under FET gate (71) indicates the amount of electrons forced from the substrate region by the application of $V_{in}$. Since the channel is electronically isolated by FET (70) and FET substrate regions (63, 65 and 67) are electronically coupled by heavy (ion) diffusion implants (64, 66), the charge forced out from underneath FET gate (71), due to the application of $V_{in}$ to FET gate (71), must move to the channel underneath FET gates (72) and (73). As charge moves under FET gate (72), the charge temporarily will cause the voltage on that gate (72) to change. But since the amplifier (78) will adjust its output (77) so that its input terminals (75, 76) are at the same voltage, and since the output (77) of the amplifier (78) is coupled to the input of the amplifier through the channel (65–67) connecting FET gates (72) and (73), FET gate (72) will be maintained at $V_{ref}$. Therefore, essentially all of the charge forced from underneath FET gate (71) will be transferred to underneath FET gate (73). The double cross hatch (95) in FIG. 13 indicates the additional charge that has moved under gate (73).

Figure 14:
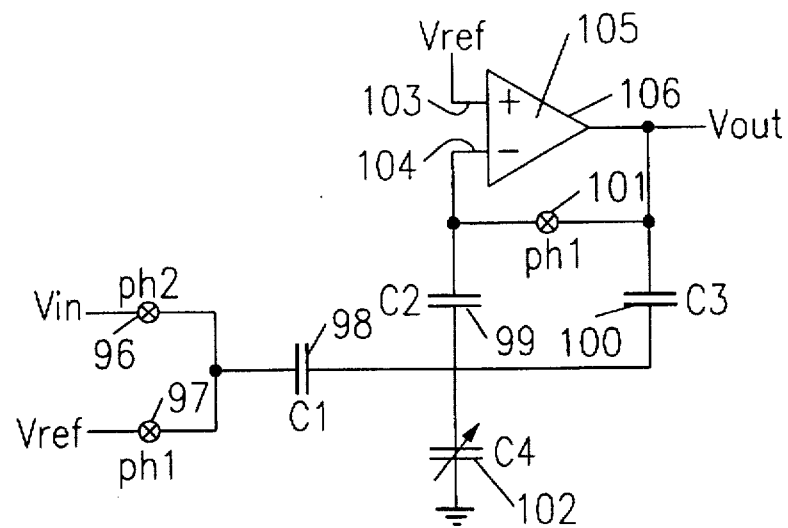
FIG. 14 is a simplified functional equivalent circuit of the circuit shown in FIG. 6.

The gain of the amplifier system of FIG. 6 can be calculated by conceptually treating FETs (31) and (33) as capacitors. In these applications, the channel coupled semiconductors are acting electronically in a manner similar to MOS capacitors, in which the light (ion) diffusion underneath each gate acts as one electrode and the polysilicon gate acts as the second electrode. A functionally simplified equivalent of the circuit of FIG. 6 is shown in FIG. 14. The variable capacitor C4 (102) indicates the non-linear parasitic capacitance of the channel charge regions to the bulk used in the present invention. But since C4 is kept at a constant voltage by the operation of the amplifier (105), the parasitic capacitance of C4 (102) is not noticeable and thus non-linearity is not a concern.

The charge held on a MOS capacitor is equal to the capacitance of the MOS capacitor multiplied by the voltage across the thin oxide, insulator layer:

$$Q = CV \quad (1).$$

In the example shown in FIGS. 10–13, the amount of charge (91) forced out from the substrate region (63) underneath FET gate (71) is equal to $C_1$ ($V_{in}-V_{ref}$), where $C_1$ is the gate oxide capacitance of FET (71). Since the amount of charge forced from underneath FET gate (71) is equal to the amount of new charge transferred to the substrate (67) underneath FET gate (73), the following relationship results:

$$C_1(V_{in}-V_{ref}) = C_2(V_{ref}-V_{out}) \quad (2),$$

where $C_2$ is the gate oxide capacitance of FET (73). By rearranging equation (2), the following relation is found:

$$(V_{out}-V_{ref})/(V_{in}-V_{ref}) = -C_1/C_2 \quad (3).$$

Thus, by adjusting the gate oxide capacitance of FETs (71) and (73), the gain of a channel coupled semiconductor, inverting, fixed-gain amplifier can be chosen.

The intrinsic gate oxide capacitance of a FET is:

$$C = \epsilon_{ox} A/l \quad (4),$$

where $\epsilon_{ox}$ is the permittivity of silicon dioxide (approximately 0.35 pF/cm); A is the area of the top electrode (the gate) and l is the thickness of the silicon dioxide layer. Gregorian and Temes, p. 69. This relationship can be employed to adjust the gate oxide capacitance of the FETs used in the present invention. In the case of the channel coupled semiconductors of the present invention, the FETs are physically located close to each other; thus, manufacturing variability between transistors should be low. Therefore, $\epsilon_{ox}$ and l can be expected to be approximately equal for each FET in the channel. With this fact in mind and substituting equation (4) into equation (3), the gain of the present amplifier system will be proportional to the area of the gates of FETs (71) and (73):

$$(V_{out}-V_{ref})/(V_{in}-V_{ref}) = -A1/A2 \quad (5).$$

Since the ratio of the areas of FET gates can be a well controlled parameter in most digital fabrication processes, highly accurate fixed-gain amplifiers are possible using the present invention.

The reader will note that the area of the gate (72) connected to the inverting (−) input terminal (75) of the operational amplifier (78) is not included in the gain calculation. Since the charge underneath this gate is kept constant during the reset, post-reset and computation phases, this gate does not play a role in adjusting the gain of the system. Thus, the designer may want to make the area of gate (72) as small as possible to minimize the silicon wafer area necessary to implement each signal processing function. But for design purposes, the size of the gate connected to the amplifier input should be correlated to the amplitude of the input signal. Simply stated, for large amplitude input signals gate (72) should be large and conversely, for small amplitude input signals gate (72) can be made small.

The necessity for adjusting the size of gate (72) is based upon the amount of time the amplifier takes to settle after the input signal has been applied to gate (71). When a negative input signal is initially applied to the channel coupled semiconductors, the surface voltage of the channel will fall until the proper amount of charge has been transferred from the substrate region (63) underneath (input) gate (71) to the substrate region (67) underneath (output) gate (73). If the surface voltage of the channel were to fall sufficiently to cause the channel reset device (70) to conduct, some charge would spill out of the channel, thereby affecting the accuracy of the circuit. By enlarging the area of (sense) gate (72) (and thereby the channel), the fall in channel surface voltage is reduced by the increased surface area and charge capacity of the channel. Thus by increasing the size of (sense) gate (72), the negative input range is increased. Therefore, choosing the area of (127, 128) gate (72) is entirely within the discretion of the IC designer and can be tailored to each signal processing situation.

Although the FETs of this example are similar to substrate-to-polysilicon MOS capacitors, the performance of the present channel coupled semiconductors does not suffer from the non-linear voltage coefficient of such capacitors. Since the operational amplifier holds the surface voltage of the channel at a constant level, the channel-to-substrate parasitic capacitance is not problematic. Thus, the "capacitance" of the channel coupled semiconductors used according to the present invention is first order linear.

Although not necessary to practice the present invention, the accuracy of the circuit shown in FIG. 6 can be improved using various design refinements. First, the gate perimeter ratio of FETs (31) and (33) is an important consideration because the FETs are communicating between the edges of the gates. As a result of current IC manufacturing processes, the edges of the gates (top electrode) are subject to random variation. In order to minimize the absolute error of each of the channel coupled semiconductors, the shape of the gates should be square. The relative error of channel coupled feedback circuits can also be minimized by ratioing the gates of the CCSCs. A common technique for increasing the accuracy of traditional monolithic capacitor ratios is to connect identically sized smaller capacitors ("unit capacitors") in parallel to construct a larger capacitor. Similarly, in order to increase the accuracy of channel coupled feedback circuits, identically sized smaller gates (and in parallel the substrates underneath the gates) can be connected in parallel to construct larger "capacitors." For further instruction on the use of perimeter ratioing and unit capacitors to improve the accuracy of analog processing circuits employing capacitors, see Gregorian and Temes, pp. 90–93; McCreary, Matching Properties, and Voltage and Temperature Dependence of MOS Capacitors, *IEEE J. Solid-State Circuits*, SC-16, 608–618 (1981).

Figure 15:
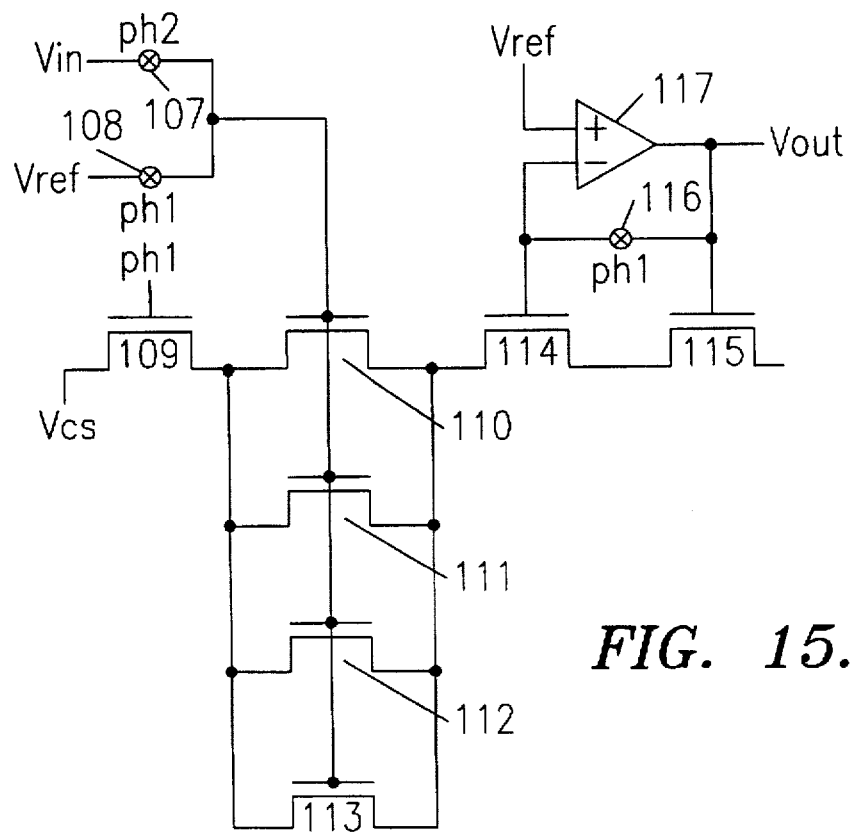
FIG. 15 is a schematic of the circuit of FIG. 6 that has been constructed with "unit gates."

Channel coupled feedback circuits can be constructed with "unit gates" to minimize the effects of manufacturing variation. That is, identically sized gates can be connected to form the channel coupled semiconductors. Referring to FIG. 15, the circuit of FIG. 6 has been constructed with "unit gates" in a configuration having a 4× voltage gain. Each of gates (110–113, 115) is an identically sized square gate. Gates (110–113) are connected to the input signal and the substrate regions underneath those gates are connected to form the channel. Those skilled in the art will recognize that a wide variety of circuit designs and layouts can be implemented using "unit gates" without departing from the spirit of the present invention.

Figure 16:
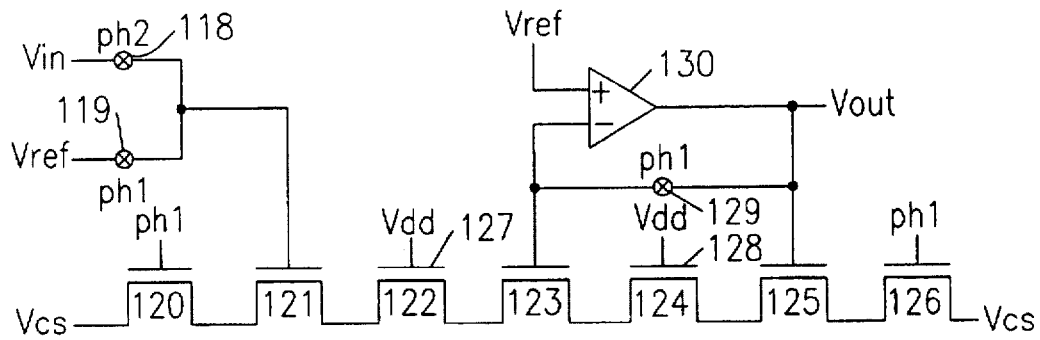
FIG. 16 is a schematic of an inverting, fixed-gain amplifier constructed according to the present invention having two FETs (122, 124) to decouple the gates of FETs (121, 123) and FETs (123, 125) in order to eliminate perimeter coupling (sidewall capacitance).

Second, to decouple the parasitic capacitance between the gates of the channel coupled semiconductors (sidewall capacitance), two or more additional FETs can be added to the circuit of FIG. 6. Preferably, applicant employs the use of transistors, although a device having just an overlapping gate and a semiconductor substrate (no additional source or drain implants) is sufficient for this decoupling function. Referring to FIG. 16, FETs (122) and (124) have been added between channel FETs (121)/(123) and (123)/(125). The gates (127, 128) of FETs (127) and (128) are held at a constant voltage throughout the reset, post-reset and computation phases. In this case, the constant voltage is the high rail of the power supply, $V_{dd}$. Since FETs (122) and (124) are n-FETs, a high voltage on the gate makes the n-FET conductive. Therefore, FETs (122), and (124) allow charge to pass underneath the gates, but remove the parasitic (sidewall) capacitance between FETs (121), (123) and (125).

Those skilled in the art will recognize that the inverting, fixed-gain amplifier described herein can be used to amplify any input signal regardless of whether the signal is characterized as an "analog" or a "digital" signal. The reader will also note that the teachings provided with regard to the present preferred embodiment are applicable to the additional examples and are incorporated into all of the additional examples.

One additional design consideration when using channel coupled semiconducting according to the present invention is that the input and output voltage ranges of channel coupled feedback devices are limited by the need to keep channel charge under all FETs in the channel. If the input signal is driven below the charge source voltage plus the characteristic transistor threshold, $V_{CS}+V_T$, then the channel underneath the input FET has no charge beneath it, thus changing the influence the input level has on the rest of the circuit drastically.

Similarly, for the output voltage range, the output can never drop below $V_{CS}+V_T$. Since $V_{CS}$ is a low voltage (possibly electrical ground) and $V_T$ is typically less than a volt, the restrictions on input and output ranges are noticeable but not a substantial hindrance in most circuit designs.

The following examples serve as additional illustrations of the use of the present invention and should not be construed as limitations of the claimed invention. Those skilled in the art will recognize that numerous modifications can be made to the circuits described herein to tailor the performance of the circuit to a specific application without departing from the spirit of the invention. Furthermore, applicant has described herein various signal processing circuits that may serve as building blocks of larger, more complicated applications, such is as ladder filters, for example. These larger circuits are encompassed within the scope of the present invention.

ADDITIONAL EXAMPLES

Example 1
Non-Inverting, Fixed-Gain Amplifier

Figure 17:
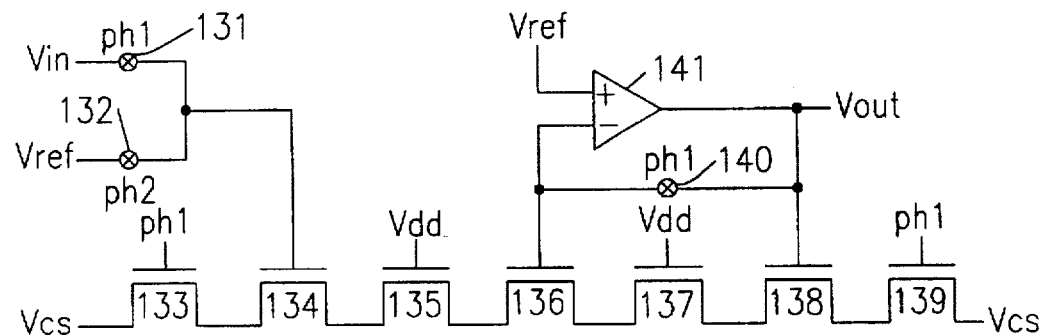
FIG. 17 is a schematic of a non-inverting, fixed-gain amplifier constructed according to the present invention.

Referring to FIG. 17, a non-inverting, fixed-gain amplifier can be constructed according to the present invention. As can be seen by comparison to FIG. 16, the only difference between the two circuits is that the clocking of switches (131) and (132) has been swapped. The clocking scheme shown in FIG. 7 also is appropriate to operate this non-inverting amplifier. As was previously discussed above, the use of FETs (135, 137) is optional and at the discretion of the IC designer. Also note that a second (optional) channel reset device (139) has been included.

Example 2
Offset Compensated Inverting, Fixed-Gain Amplifier

Figure 18:
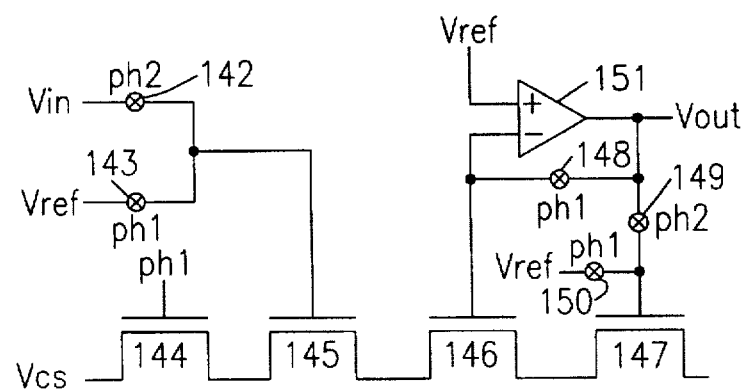
FIG. 18 is a schematic of an offset compensated, inverting, fixed-gain amplifier constructed according to the present invention.

One nonideal effect that can degrade the performance of practical amplifiers is offset voltage. To reduce the effects of operational amplifier offset voltage in a channel coupled feedback, inverting, fixed-gain amplifier system, a few additional components may be added to the circuit in FIG. 6. Referring to FIG. 18, switch (149) is added and is controlled by the ph2 clock of FIG. 7. Switch (150) is also added and is controlled by the ph1 clock of FIG. 7. The drain of switch (150) is connected to the gate of FET (147) and the source of switch (150) is connected to $V_{ref}$.

When the ph1 clock is high and the ph2 clock is low (reset phase), the output of the operational amplifier is shorted to its inverting input and the amplifier performs as a unity-gain follower, having an output voltage of $V_{ref}+V_{offset}$. Also in this clock phase, switch (142) is open and switch (143) is closed; therefore FET gate (145) is set to $V_{ref}$. Likewise, FET gate (147) is also set to $V_{ref}$ by the operation of switch (150). Therefore, gate (146) is set to $V_{ref}+V_{offset}$. When ph1 is low and ph2 is high (computation phase), $V_{in}$ is connected to gate (145) and gate (147) is connected to the output of the amplifier (151). Since $V_{offset}$ was added to gate (146) during the reset phase, the output of the operational amplifier will be corrected for the offset voltage during the computation phase.

Those skilled in the art will recognize that the offset compensation teaching of this example can be applied to any of the examples described herein to cancel operational amplifier offset voltage.

Example 3
Offset Compensated Sample and Hold

Those skilled in the art will recognize that the inverting, fixed-gain amplifier of the preferred embodiment can also function as a sample and hold circuit. The sample and hold periods of the circuit operation can be adjusted by changing the widths of the ph1 and ph2 clocks, while maintaining the non-overlapping phases. Also, the offset compensated, inverting, fixed-gain amplifier of FIG. 18 can also perform the offset compensated, sample and hold function.

Figure 19:
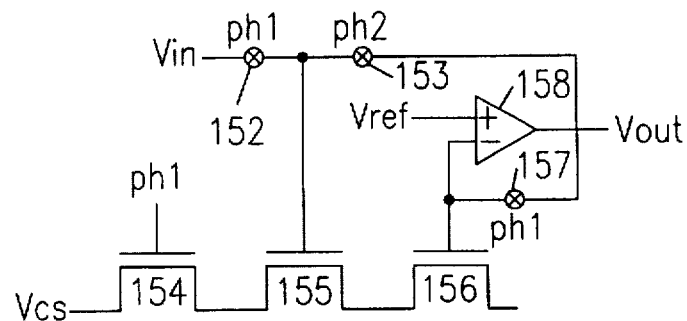
FIG. 19 is a schematic of an offset compensated, sample and hold circuit constructed according to the present invention.

In addition, FIG. 19 shows a simple offset compensated sample and hold circuit constructed with fewer components than the previous examples. This circuit can also be implemented using the non-overlapping clocks of FIG. 7. When ph1 is high, gate (155) acquires voltage $V_{in}+V_{offset}$. When ph2 is high, the output voltage is therefore $(V_{in}+V_{offset})-V_{offset}=V_{in}$.

Example 4
Addition Circuit

Figure 20:
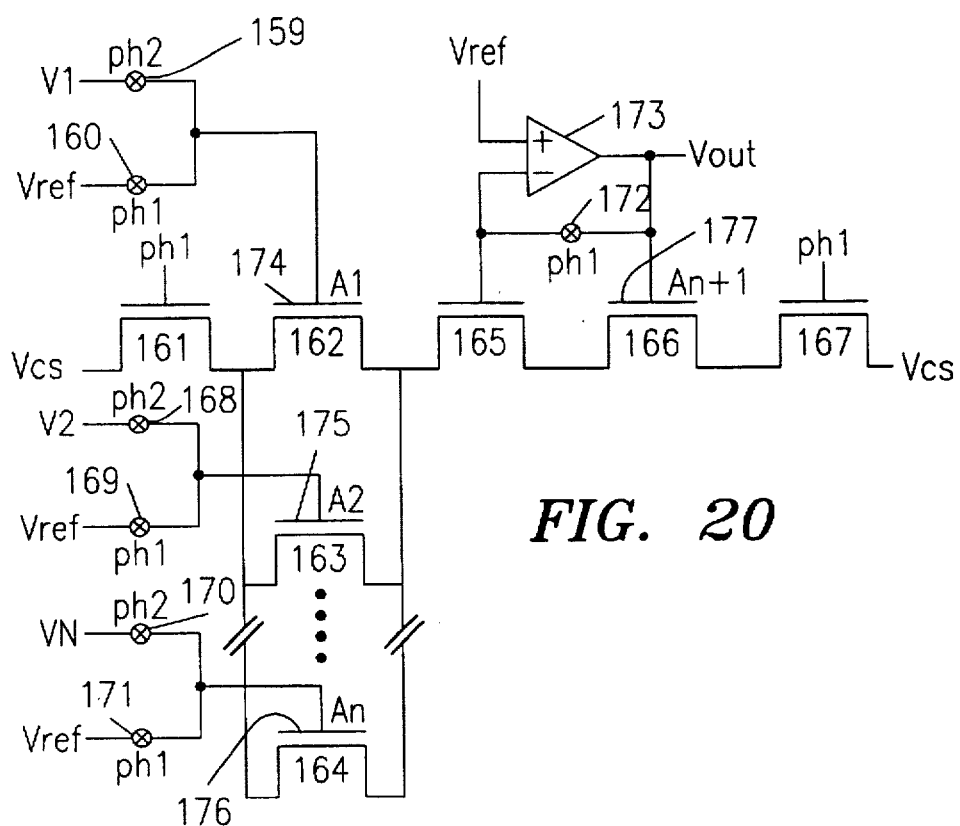
FIG. 20 is a schematic of an addition circuit constructed according to the present invention.

A circuit for adding input signals can be constructed according the present invention and is shown in FIG. 20. In this illustration, n input signals may be added. Any linear combination of the input signals can be made by adjusting the area ("capacitance") of gates (174–176). As was shown in Equation 5 above, the output voltage in this example will be equal to $-[A1(V1-V_{ref})+A2(V2-V_{ref})+ \ldots +An(VN-V_{ref})]/An+1$.

Example 5
Subtraction Circuit

Figure 21:
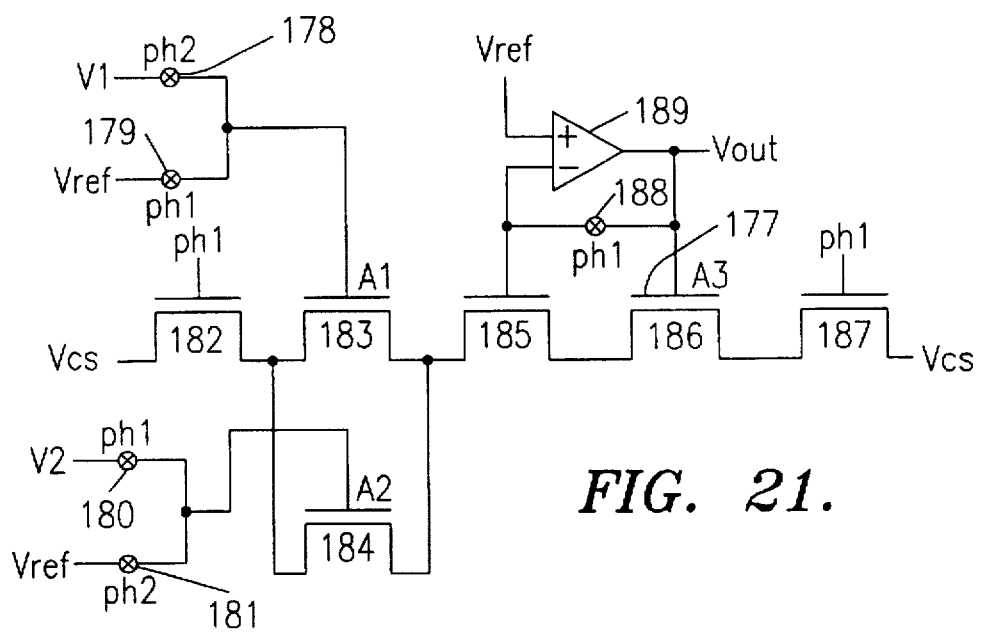
FIG. 21 is a schematic of a subtraction circuit constructed according to the present invention.

Similar to the addition circuit of Example 4, a subtraction circuit can be constructed by inverting the clock phase of the input signal(s) (180, 181) to be subtracted. For simplicity, the subtraction of two input signals is shown in FIG. 21. But as in FIG. 20, the array of input signals can be increased by adding additional gates and the IC designer is free to choose the number of inputs to be subtracted.

Example 6
Integrating Amplifiers

Figure 22:
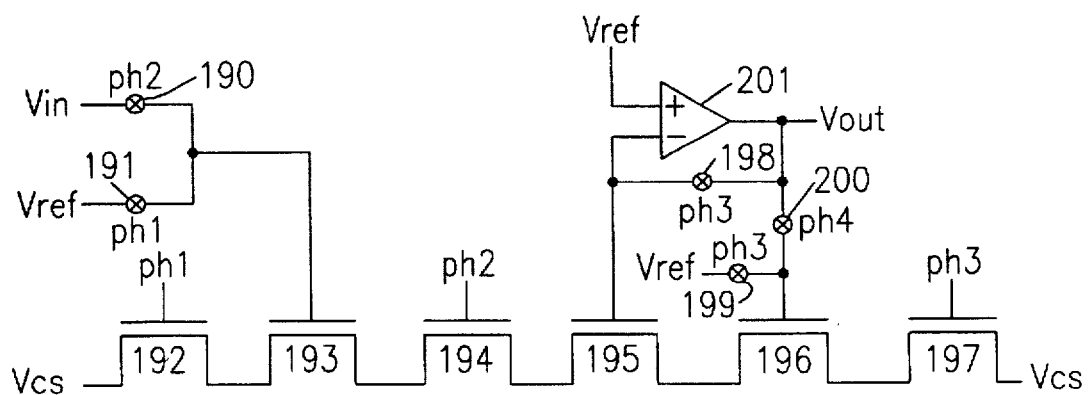
FIG. 22 is a schematic of an inverting, offset compensated integrating amplifier constructed according to the present invention.
Figure 23:
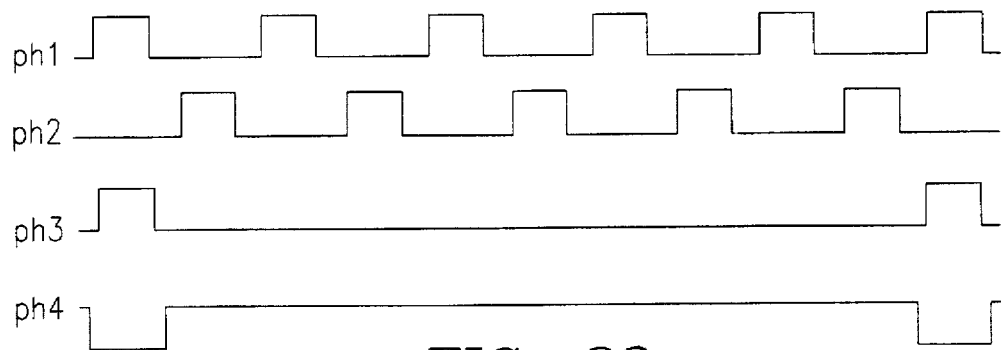
FIG. 23 is a clocking scheme appropriate to implement the circuits of FIGS. 22 and 24.

Referring to FIG. 22, an inverting, integrating offset compensated amplifier constructed according to the present invention is shown. The reader will note that the construction of the components for the inverting, integrating offset compensated amplifier is similar to an inverting, fixed-gain, offset compensated amplifier. The only differences are that FET (194) is connected to the ph2 clock, and the reset and offset compensation signals are controlled by ph3 and ph4, which act as global reset signals. The clocking scheme shown in FIG. 23 is appropriate to operate this integrating amplifier.

Those skilled in the art by now will recognize that FET (194) should be constructed, and ph2 chosen, such that an electron barrier is created in the channel underneath FET (194) when $V_{ref}$ is applied to the gate of FET (193).

FET (194) also serves to decouple FET (193) from FET (195), because FET (194) is being driven by an external voltage source.

A non-inverting, offset compensated integrating amplifier can also be constructed according to the teaching in Example 1 by swapping the clock signals to switches (190) and (191).

Example 7
An Inverting, Offset Compensated Differentiating Amplifier

Figure 24:
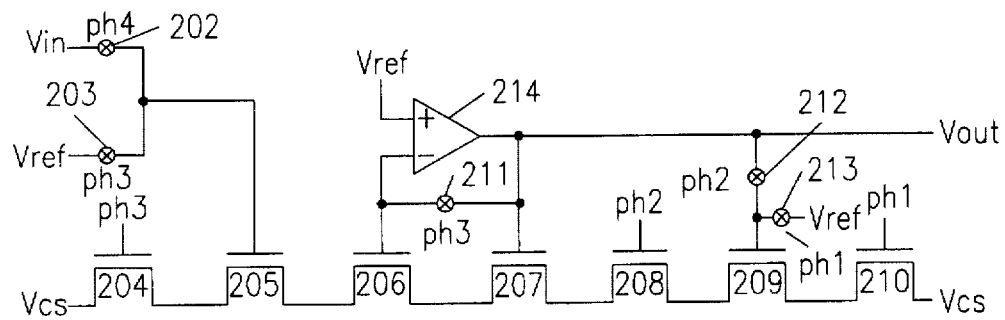
FIG. 24 is a schematic of an inverting, offset compensated differentiating amplifier constructed according to the present invention.

Referring to FIG. 24, an inverting, offset compensated differentiating amplifier constructed according to the present invention is shown. The reader will note that the construction of the components for the inverting, offset compensated differentiating amplifier is similar to the inverting, fixed-gain amplifier shown in FIG. 16. To perform the differentiating function, additional gates are added. $V_{out}$ can be connected to the gate of FET (209) when ph2 is high. When ph1 is high and ph2 is low, the gate of FET (209) is connected to $V_{ref}$. Again, the clocking scheme in FIG. 23 is appropriate to implement this example. Those skilled in the art will recognize that FET (208) should be constructed so that an electron barrier is created in the channel underneath FET (208) when $V_{out}$ is applied to the gate of FET (207).

FET (208) also serves to decouple FET (207) from FET (209), because FET (208) is being driven by an external voltage source.

Figure 25:
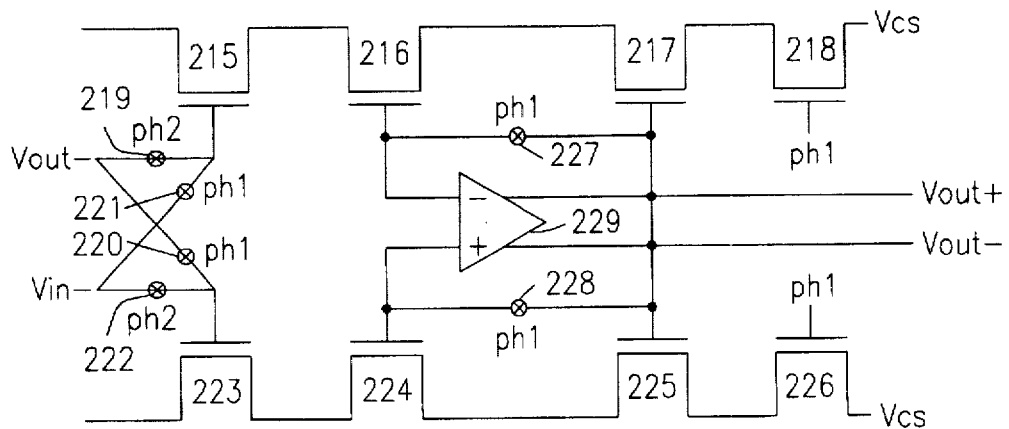
FIG. 25 is a schematic of a fully differential amplifier constructed according to the present invention.

Those skilled in the art will recognize numerous modifications to the circuits presented here. For example, all transistors can be p-FETs and the computation charge can be holes instead of electrons. Furthermore, the circuits thus described have only been single-sided. A fully differential fixed gain inverting amplifier is shown in FIG. 25.

Example 8
Digital-to-Analog Converter

A digital-to-analog converter (DAC) can be constructed according to the teachings of Example 4, the addition circuit. Referring to FIG. 26, the reader will note the similarities to FIG. 20. A DAC may be structured to convert a digital word using a weighted array of capacitors. The output of the array of capacitors is sensed by an amplifier to generate the analog signal.

FIG. 26 shows a 3-bit DAC constructed according to the present invention. As is standard for a weighted array of capacitors, the most significant bit of the digital word is applied to the largest gate (236) and the least significant bit is applied to the smallest gate (238). The linear combination of the voltages added to gates (236–238) causes charge to shift to the channel underneath gate (240). The clocking for switches (230–235) can be generated by the logic circuit shown in FIG. 27.

The logic of FIG. 27 selects which transition direction (either up or down) the input gates of the weighted capacitor array are driven during the computation phase of the circuit. The transition direction depends on the digital input word of the DAC.

This DAC can, of course, be expanded to convert larger digital words by adding progressively larger gates to the weighted array. Unit gates as shown in FIG. 15 can also be used to implement this DAC. Further, offset compensation can be added to improve the accuracy of this circuit as was taught in Example 2. Those skilled in the art will recognize that this DAC is simply one illustration of a DAC that can be implemented with channel coupled semiconductors and that numerous variations in the design and layout can be made to tailor the DAC to the intended performance specifications.

Example 9
Analog-to-Digital Converter

A successive approximation analog-to-digital converter (ADC) can be constructed using components previously described in Examples 3 and 8. FIG. 28 shows a block diagram of a conventional successive approximation ADC. See e.g., Gregorian and Temes, pp. 420–425. The DAC block (248) can be implemented with the DAC described in Example 8. The Sample and Hold block (246) can be implemented with the sample and hold circuit described in Example 3. The comparator (249), successive approximation shift register (250) and switch logic (247) all can be implemented with conventional circuits.

Figure 29:
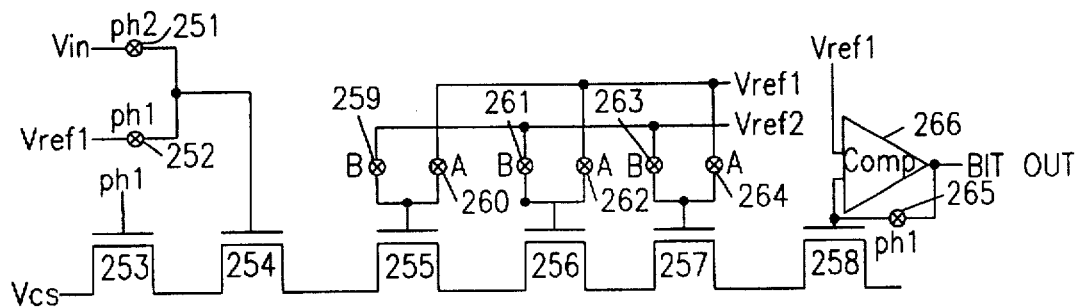
FIG. 29 is a schematic of a digital to analog converter combined with a comparator which can implement an analog-to digital converter constructed according to FIG. 28.

More preferably, applicant constructs an ADC according to FIG. 29. A logic circuit that is appropriate for generating the clock signals to switches (259–264) is shown in FIG. 27.

The circuit of FIG. 29 is a combined DAC and comparator that compares the digital word input with the input voltage, $V_{in}$. In this illustration, the reader will note that the comparator (266) is used to determine whether the surface voltage has been raised above $V_{ref}$ during the computation phase. Thus, the channel surface voltage is not kept constant during the performance of the signal processing operation. Again, those skilled in the art will recognize the various additions and modifications that can be made without affecting the ADC function.

Example 10
Switchable Gain Amplifier

Figure 30:
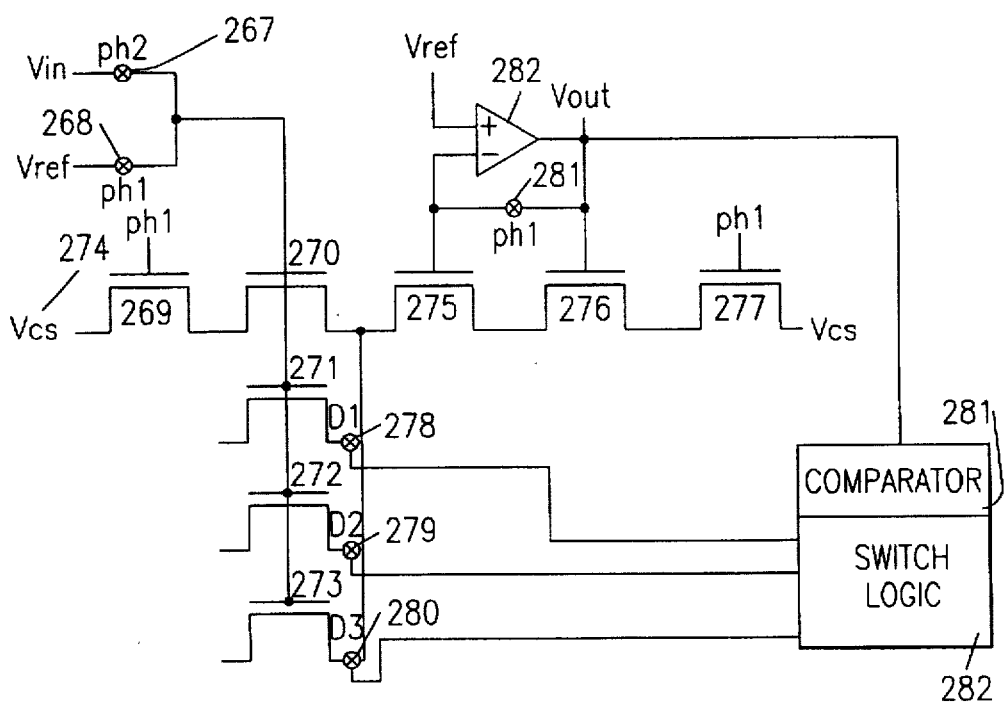
FIG. 30 is a switchable gain, inverting amplifier constructed according to the present invention that can be used in an automatic gain control system.

The unit gate configuration of FIG. 15 can be modified to provide a switchable gain amplifier. Referring to FIG. 30, switches (278–280) have been added that allow the number of gates in the array to be added during the computation phase. The clock scheme of FIG. 7 is appropriate to clock the ph1 and ph2 switches. Switches (278–280) may be controlled by signals generated from a switch logic circuit. Once again, the IC designer has great latitude in determining the signals to be generated depending upon the application and the function and performance desired.

Also, the reader will note that the switchable gain amplifier of FIG. 30 can serve as the basis for an automatic gain control (AGC) system by adding a comparator function (298) is to generate the switch logic signals (299). Referring to FIG. 30, the comparator (298) and switch logic (299) functionality can be implemented with conventional circuits, thereby permitting a channel coupled feedback AGC system.

Example 11
Analog Pixel Matrix

Figure 31:
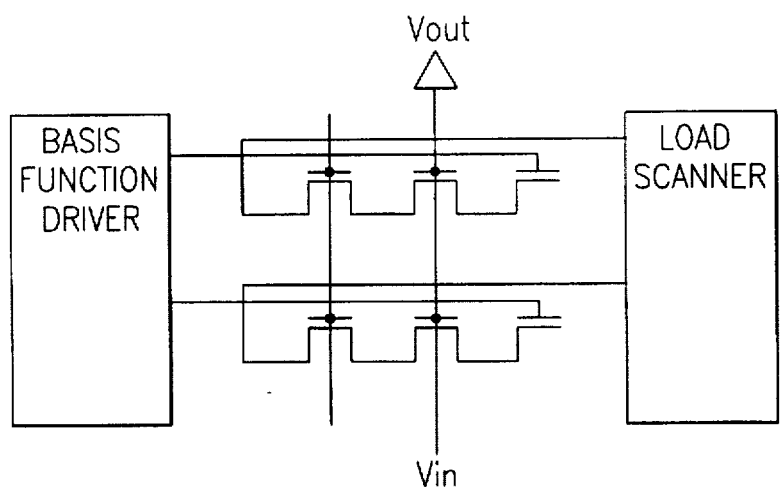
FIG. 31 is an analog pixel matrix that is implemented with channel coupled semiconductors.

Referring to FIG. 31, an analog pixel matrix for computing the linear transform of a matrix of analog values can also be constructed according to the present invention. Those skilled in the art will recognize that although some modifications have been made, the channel FETs are set to a fixed charge and the sense amplifier senses charge transferred within the channel. Further details for constructing a linear computation circuit can be found in U.S. patent application Ser. No. 08/186,372, the disclosure of which is incorporated herein by reference.

Example 12
Method of Manufacturing Charge Coupled Feedback Circuits

As has been described at length herein, many signal processing functions now can be implemented in digital IC fabrication processes that only provide for the construction of field effect transistors. But applicant does emphasize that the use of a digital IC fabrication process is not a limitation of the present invention; rather, it is an advantage since digital IC fabrication processes are currently the least expensive IC fabrication processes. The IC designer may implement circuits of the present invention in any IC fabrication process that provides for field effect transistors, including specialty IC fabrication processes that provide high accuracy passive components.

Figure 32:
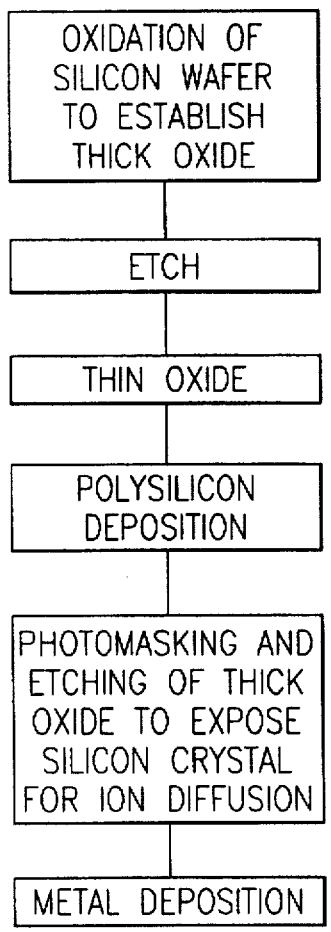
FIG. 32 is a flow chart for the manufacture of an inverting, fixed-gain operational amplifier according to the present invention.

FIG. 32 shows a flow chart of a method that may be used to fabricate channel coupled feedback circuits. This method is merely one illustration and those skilled in the art will recognize that a variety of additions and modifications may be made to this protocol.

Applicant has described a channel coupled feedback technology that can be used to implement a variety of signal processing functions. Those skilled in the art will recognize that the present channel coupled feedback technology can be used to implement other signal processing circuitry in which passive components, such as capacitors or resistors, are necessary using previous circuit designs, including signal processing circuits that have not been explicitly disclosed herein.

The present invention therefore provides the advantageous feature that monolithic circuit functionality, previously requiring passive components, can now be implemented solely with semiconductors, preferably FETs. Since these circuit functions only require FETs, conventional digital IC fabrication processes can be used that are less expensive than the special fabrication processes currently required to fabricate accurate monolithic capacitors and resistors. Because capacitors and resistors are not required, integration density of equivalent circuit functionality is improved, thereby reducing silicon requirements and further reducing the cost of implementing the desired circuit functionality. Also, since the surface of the channel is maintained at a constant voltage in most of the examples provided, the channel coupled semiconductors do not experience the first order non-linearity problems of substrate-to-polysilicon MOS capacitors.

Other aspects and advantages of the present invention will be apparent to those skilled in the art upon review of the present disclosure. Those skilled in the art will also recognize that numerous changes can be made to the circuits described herein without departing from the spirit of the invention. The following claims set forth the scope of the present invention, which claims are not to be limited by the particular embodiments described above in the specification.

I claim:

1. A circuit for processing a first input signal into an output signal, wherein the circuit has at least a reset operation and a signal processing operation, comprising:

an amplifier having at least one input terminal and at least one output terminal;

a first channel coupled semiconductor (CCSC) device having a gate and substrate region located beneath the gate of the first CCSC device, wherein the gate of the first CCSC device is electrically connected to the first input signal during the signal processing operation;

a second CCSC device having a gate and a substrate region located beneath the gate of the second CCSC device, wherein the gate of the second CCSC device is electrically connected to the input terminal of the amplifier;

a third CCSC device having a gate and a substrate region located beneath the gate of the third CCSC device, wherein the gate of the third CCSC device is electrically connected to the output terminal of the amplifier, wherein the substrate regions of the first, second and third CCSC devices are electrically connected to permit electric charge to be conducted between the substrate regions of the first, second and third CCSC devices when the gate of the first CCSC device is electrically connected to the first input signal, whereby the substrate regions of the first, second and third CCSC devices and the electrical connections between the substrate regions define a channel and wherein the amplifier and the second and third CCSC devices are connected in a negative feedback configuration; and at least one channel reset device, wherein the channel reset device electrically connects a source of charge to the channel during the reset operation.

2. A circuit as in claim 1 wherein the amplifier, the first, second and third CCSC devices and the channel reset device are monolithically integrated.

3. A circuit as in claim 1 further comprising a fourth CCSC device having a gate and a substrate region located beneath the gate of the third CCSC device, wherein the substrate region of the fourth CCSC device is electrically connected to the channel.

4. A circuit as in claim 3 wherein the fourth CCSC device serves as a means for electrically connecting the substrate regions of the first and second CCSC devices.

5. A circuit as in claim 4 further comprising a fifth CCSC device having a gate and a substrate region located beneath the gate of the fifth CCSC device, wherein the fifth CCSC device is electrically connected to the channel.

6. A circuit as in claim 5 wherein the fifth CCSC device serves as a means for electrically connecting the substrate regions of the second and third CCSC devices.

7. A circuit as in claim 6 wherein a constant voltage is applied to the gates of the fourth and fifth CCSC devices.

8. A circuit as in claim 6 wherein a constant voltage is applied to the fifth CCSC device and a two phase signal is applied to the gate of the fourth CCSC device, wherein one phase of the two phase signal causes a charge conduction barrier to form in the substrate region beneath the gate of the fourth CCSC device during the reset operation and the second phase signal permits charge to be conducted in the substrate region beneath the gate of the fourth CCSC device during the signal processing operation.

9. A circuit as in claim 8 wherein the signal processing operation integrates at least two input signals.

10. A circuit as in claim 6 wherein a constant voltage is applied to the fourth CCSC device and a two phase signal is applied to the gate of the fifth CCSC device, wherein one phase of the two phase signal causes a charge conduction barrier to form in the substrate region beneath the gate of the fifth CCSC device during the reset operation and the second phase signal permits charge to be conducted in the substrate region beneath the gate of the fifth CCSC device during the signal processing operation.

11. A circuit as in claim 10 wherein the signal processing operation differentiates at least two input signals.

12. A circuit as in claim 1 wherein the amplifier has inverting and non-inverting input terminals and wherein the gate of the second CCSC device is electrically connected to the inverting input terminal of the amplifier and a reference voltage is electrically connected to the non-inverting input terminal of the amplifier.

13. A circuit as in claim 1 wherein at least one of the CCSC devices is a field effect transistor.

14. A circuit as in claim 1 wherein the gate of at least one of the CCSC devices comprises polysilicon.

15. A circuit as in claim 1 wherein the substrate regions of the first, second and third CCSC devices are connected by an electrical connection means and wherein the electrical connection means is selected from the group consisting of a heavy ion diffusion implant, polysilicon, metal, a charge-coupled device and a field effect transistor biased to be conductive.

16. A circuit as in claim 1 wherein the channel reset device is selected from the group consisting of a field effect transistor, a bipolar transistor, a charge coupled device and a T-gate switch.

17. A circuit as in claim 1 wherein the gates of the first and third CCSC devices have equal areas.

18. A circuit as in claim 1 further comprising a sixth CCSC device having a gate and substrate region located beneath the gate of the sixth CCSC device, wherein the substrate region is electrically connected to the channel during the signal processing operation and the gate is connected to a second input signal during the signal processing operation.

19. A circuit as in claim 18 wherein the signal processing operation is selected from the group consisting of addition and subtraction.

20. A circuit as in claim 1 further comprising a seventh CCSC device having a gate and a substrate region located beneath the gate of the seventh CCSC device, wherein the substrate region of the seventh CCSC device is electrically connected to the channel during the signal processing operation, wherein the gate of the first CCSC device is electrically connected to a reference signal selected from a group consisting of a first reference signal and a second reference signal, the gate of the seventh CCSC device is electrically connected to a reference signal selected from the group consisting of the first reference signal and the second reference signal and the gate of the first CCSC device has an area that is twice the area of the gate of the seventh CCSC device.

21. A circuit as in claim 1 further comprising offset compensation means electrically connected to the amplifier, whereby the output signal is offset compensated.

22. A sample and hold circuit, comprising:
an amplifier having at least one input terminal and at least one output terminal;
a first channel coupled semiconductor (CCSC) device having a gate and substrate region located beneath the gate of the first CCSC device, wherein the gate is electrically connected to an input signal in a first phase of operation and to the output terminal of the amplifier in a second phase of operation;
a second CCSC device having a gate and substrate region located beneath the gate of the second CCSC device, wherein the gate is electrically connected to the input terminal of the amplifier and during the first phase of operation the gate also is electrically connected to the output terminal of the amplifier and wherein the substrate regions of the first and second CCSC devices are electrically connected; and
at least one channel reset device, wherein the channel reset device electrically connects a source of charge to the substrate regions of the first and second CCSC devices during a reset operation.

23. A sample and hold circuit as in claim 22 wherein at least one of the CCSC devices is a field effect transistor.

24. An analog-to-digital converter, comprising:
a comparator having at least one input terminal and one output terminal, wherein the comparator provides a digital output;
a first channel coupled semiconductor (CCSC) device having a gate and substrate region located beneath the gate of the first CCSC device, wherein the gate is connected to an analog input signal;
a second and a third CCSC device, each having a gate and a substrate region located beneath the respective gate, wherein the gate of the second CCSC device is electrically connected to a signal selected from the group consisting of a first reference signal and a second reference signal and the gate of the third CCSC device is electrically connected to a signal selected from the group consisting of the first reference signal and the second reference signal;
a fourth CCSC device having a gate and a substrate region located beneath the gate of the fourth CCSC device, wherein the gate is connected to the input terminal of the comparator and wherein the substrate regions of the first, second, third and fourth CCSC devices are electrically connected; and at least one channel reset device, wherein the channel reset device electrically connects a source of charge to the substrate regions of the first, second, third and fourth CCSC devices during a reset operation.

25. An analog-to-digital converter as in claim 24 further comprising a fifth CCSC device having a gate and a substrate region located beneath the gate of the fifth CCSC device, wherein the gate is electrically connected to a signal selected from the group consisting of the first and the second reference signal and the substrate region is electrically connected to the substrate regions of the first, second, third and fourth CCSC devices.

26. An analog-to-digital converter as in claim 25 wherein at least one of the CCSC devices is a field effect transistor.

27. An amplifier circuit utilizing negative feedback and having at least a reset operation and a signal processing operation, comprising:

an operational amplifier having at least one input terminal and at least one output terminal;

a first, second and third FET, wherein each FET has a gate and a substrate region underneath each gate, wherein the substrate regions of the first, second and third FETs are electrically connected to permit electric charge to be conducted between the substrate regions when a first input signal is connected to the gate of the third FET, wherein the gate of the first FET is electrically connected to the input terminal of the operational amplifier, wherein the gate of the second FET is electrically connected to the output terminal of the operational amplifier, and wherein an output signal is generated that is based upon the first input signal; and at least one charge reset device, wherein the charge reset device electrically connects a source of electric charge to the substrate regions of the first, second and third FETs during the reset operation.

28. An amplifier circuit as in claim 27 wherein the gates of the second and third FETs have equal areas.

29. An amplifier circuit as in claim 27 further comprising a fourth FET having a gate and a substrate region underneath the gate, wherein the substrate region of the fourth FET is electrically connected to the substrate regions of the first, second and third FETs and the gate of the fourth FET is electrically connected to a signal selected from a group consisting of the first input signal and a second input signal.

30. An amplifier circuit as in claim 29 wherein the gates of the second, third and fourth FETs have equal areas.

31. An amplifier circuit as in claim 29 further comprising a fifth FET having a gate and a substrate region underneath the gate, wherein the substrate region of the fifth FET is electrically connected to the substrate regions of the first, second, third and fourth FETs and the gate of the fifth FET is electrically connected to a signal selected from a group consisting of the first input signal, the second input signal and a third input signal.

32. An amplifier circuit as in claim 31 wherein the gates of the second, third, fourth and fifth FETs have equal areas.

33. An amplifier circuit as in claim 31 wherein the gates of the third, fourth and fifth FETs are defined by an area and the gate area of the fourth FET is twice the gate area of the fifth FET and the gate area of the third FET is twice the gate area of the fourth FET.

34. An amplifier circuit as in claim 33 further comprising a plurality of switches, wherein the switches electrically connect the gates of the third, fourth and fifth FETs to the signal selected from the group consisting of the first input signal and the second input signal.

35. An amplifier circuit as in claim 34 further comprising:

a comparator having at least one input terminal and an output terminal, wherein the input terminal of the comparator is electrically connected to the output terminal of the operational amplifier; and switch logic means, wherein the switch logic means process signals generated by the comparator and in response to the comparator signals the switch logic means control the plurality of switches.

36. An amplifier circuit as in claim 27 wherein the the input and output terminals of the operational amplifier are electrically connected by a switch, wherein the switch is closed during the reset operation and the operational amplifier is reset and wherein the switch is open during the signal processing operation.

37. An amplifier circuit as in claim 27 wherein the substrate regions of the first and second FETs have surface regions which have surface potentials that are held constant by the operational amplifier during the signal processing operation.

38. A circuit as in claim 1 wherein the channel has a surface region which has a surface potential that is held constant by the amplifier during the signal processing operation.

* * * * *